(12) United States Patent (10) Patent No.: US 9,178,489 B2
Yoshimi et al. (45) Date of Patent: Nov. 3, 2015

(54) CIRCUIT MODULE

(71) Applicant: Murata Manufacturing Co., Ltd., Kyoto (JP)

(72) Inventors: Syunji Yoshimi, Kyoto (JP); Kenji Saito, Kyoto (JP); Shingo Yanagihara, Kyoto (JP); Yuki Higashide, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/628,564

(22) Filed: Feb. 23, 2015

(65) Prior Publication Data

US 2015/0162890 A1 Jun. 11, 2015

Related U.S. Application Data

(63) Continuation of application No. PCT/JP2013/067770, filed on Jun. 28, 2013.

(30) Foreign Application Priority Data

Sep. 4, 2012 (JP) ................................. 2012-194000

(51) Int. Cl.
*H01P 1/36* (2006.01)
*H03H 7/38* (2006.01)
(Continued)

(52) U.S. Cl.
CPC .. *H03H 7/38* (2013.01); *H01P 1/36* (2013.01); *H01P 1/387* (2013.01); *H03H 2007/386* (2013.01); *H04B 1/0053* (2013.01)

(58) Field of Classification Search
CPC ............... H01P 1/32; H01P 1/36; H01P 1/38; H01P 1/383

USPC .................................................. 333/1.1, 24.2
See application file for complete search history.

(56) References Cited

U.S. PATENT DOCUMENTS

2012/0075032 A1 3/2012 Kato
2013/0049879 A1 2/2013 Akagi
2014/0080431 A1* 3/2014 Wada et al. ..................... 455/91

FOREIGN PATENT DOCUMENTS

JP 06-006113 A 1/1994
JP 2011-199602 A 10/2011
(Continued)

OTHER PUBLICATIONS

International Search Report issued in Application No. PCT/JP2013/067770 dated Sep. 17, 2013.
(Continued)

*Primary Examiner* — Stephen E Jones
(74) *Attorney, Agent, or Firm* — Pearne & Gordon LLP

(57) ABSTRACT

Isolators are disposed such that DC magnetic fields of permanent magnets intensity with each other, and thus, the input impedance of non-reciprocal circuits 3a and 3b (regulating means 3) is reduced. Accordingly, the impedance conversion ratio between the output impedance of amplifying means 2 and the input impedance of the regulating means 3 is reduced to be relatively small. Thus, by simplifying the configuration of matching means 4 disposed between the amplifying means 2 and the regulating means 3, the insertion loss of the matching means 4 can be reduced, thereby enhancing the efficiency of a circuit module 1. Additionally, it is possible to dispose the non-reciprocal circuits 3a and 3b close to each other so that the DC magnetic fields of the permanent magnets can intensity with each other, thereby increasing the design flexibility of the circuit module 1 and accordingly reducing the size of the circuit module 1.

10 Claims, 8 Drawing Sheets

(51) Int. Cl.
  *H01P 1/387* (2006.01)
  *H04B 1/00* (2006.01)

(56) References Cited

FOREIGN PATENT DOCUMENTS

| JP | 2012-039444 A | 2/2012 |
| JP | 2012-070316 A | 4/2012 |
| JP | 2012-114547 A | 6/2012 |
| WO | 2011/138904 A1 | 11/2011 |

OTHER PUBLICATIONS

Written Opinion issued in Application No. PCT/JP2013/067770 dated Sep. 17, 2013.

\* cited by examiner

CIRCUIT MODULE

BACKGROUND OF THE INVENTION

1. Field of the Invention

The present invention relates to a circuit module including amplifying means for amplifying multiple types of signals.

2. Description of the Related Art

These days, there is an increasing demand for multiband, multimode mobile communication terminals, such as cellular phones and mobile information terminals, which support multiple communication systems of different frequency bands or different modulation methods. Therefore, on a transmission side of this type of mobile communication terminal, a circuit module that supports multiple radio frequency signals of different frequency bands is mounted, as shown in FIG. 11 (for example, see Patent Document 1). A circuit module 500 shown in FIG. 11 is a module for amplifying radio frequency signals of multiple frequency bands (Bands), and includes a transmission route R1 through which input signals RFin_BC0 (800 MHz band) and RFin_BC3 (900 MHz band) are amplified and are output as output signals RFout_BC0 (800 MHz band) and RFout_BC3 (900 MHz band) and a transmission route R2 through which an input signal RFin_BC6 (2 GHz band) is amplified and is output as an output signal RFout_BC6 (2 GHz band).

In the transmission route R1, the input signals RFin_BC0 and RFin_BC3 input into a SAW filter 501 are switched by a switch 502 and are selectively input into an input terminal of a power amplifier 503. Then, the input signals RFin_BC0 and RFin_BC3 amplified by the power amplifier 503 are input into a non-reciprocal circuit 505, which is disposed subsequent to the power amplifier 503, via a coupler 504 and are output to the exterior of the circuit module 500 via a switch 506. Accordingly, the non-reciprocal circuit 505 prevents a signal reflected by, for example, an antenna element (not shown), disposed closer to the switch 506 from being output to the coupler 504 (power amplifier 503). Part of the transmission signals RFin_BC0 and RFin_BC3 amplified by the power amplifier 503 is separated in the coupler 504 and is output to the exterior of the circuit module 500 as an output signal Coupler out.

In the transmission route R2, the transmission signal RFin_BC6 input into a SAW filter 507 is input into an input terminal of a power amplifier 508. Then, the input signal RFin_BC6 amplified by the power amplifier 508 is input into a non-reciprocal circuit 509, which is disposed subsequent to the power amplifier 508, and is output to the exterior of the circuit module 500. Accordingly, as in the above-described transmission route R1, the non-reciprocal circuit 509 prevents a signal reflected by, for example, an antenna element (not shown), disposed subsequent to the isolator 509 from being output to the power amplifier 508. Part of the transmission signal RFin_BC6 amplified by the power amplifier 508 is output to the exterior of the circuit module 500 as an output signal Coupler out via a capacitor 510 which is connected at one end between the power amplifier 508 and the non-reciprocal circuit 509.

Patent Document 1: Japanese Unexamined Patent Application Publication No. 2011-199602 (Paragraphs 0012 to 0023, FIGS. 1 and 2, and so on)

BRIEF SUMMARY OF THE INVENTION

In the above-described circuit module 500, although they are not shown, matching circuits for matching the output impedance of the power amplifiers 503 and 508 to the input impedance of the non-reciprocal circuits 505 and 509, respectively, are disposed between the power amplifier 503 and the non-reciprocal circuit 505 and between the power amplifier 508 and the non-reciprocal circuit 509. However, the efficiency of the circuit module 500 is decreased by the insertion loss caused by the provision of the matching circuits. Accordingly, there is a demand for reducing the consumption of a current (increasing the efficiency) in the circuit module 500 by simplifying the configuration of the matching circuits. However, close examinations concerning this issue have not been conducted so far.

Additionally, the size of the non-reciprocal circuits 505 and 509 included in the above-described circuit module 500 is reduced by omitting the provision of a yoke for blocking a leakage of a DC magnetic field generated from a permanent magnet included in each of the non-reciprocal circuits 505 and 509 to the outside. Accordingly, in order to reduce the possibility that the characteristics of the non-reciprocal circuits 505 and 509 will be changed due to the inter-influence of DC magnetic fields of the permanent magnets included in the non-reciprocal circuits 505 and 509, the non-reciprocal circuits 505 and 509 are separated from each other and are arranged such that the directions of the DC magnetic fields of the non-reciprocal circuits 505 and 509 are orthogonal to each other. Thus, in the above-described circuit module 500, it is not possible to dispose the non-reciprocal circuits 505 and 509 close to each other, thereby reducing the design flexibility.

The present invention has been made in view of the above-described problems. It is an object of the present invention to provide a circuit module which can implement high efficiency by simplifying the configuration of matching means and which is reduced in size by disposing non-reciprocal circuits close to each other.

In order to achieve the above-described object, a circuit module of the present invention includes: amplifying means that amplifies a plurality of types of signals; regulating means that includes a plurality of non-reciprocal circuits individually disposed for the plurality of types of signals and that restricts a passing direction of each of the plurality of types of signals amplified by the amplifying means to one direction; and matching means that is disposed between the amplifying means and the regulating means and that matches output impedance of the amplifying means to input impedance of the regulating means. The plurality of non-reciprocal circuits include respective isolators. Each of the plurality of isolators includes a microwave magnetic body, a first center electrode and a second center electrode disposed on the microwave magnetic body such that the first and second center electrodes intersect with each other while being insulated from each other, and a permanent magnet that applies a direct-current magnetic field to a portion at which the first and second center electrodes intersect with each other. Among the plurality of isolators, at least two isolators are disposed such that the direct-current magnetic field of a permanent magnet of one isolator and the direct-current magnetic field of the permanent magnet of the other isolator intensify with each other.

According to the invention configured as described above, each of the isolators of the plurality of the non-reciprocal circuits included in the regulating means, which restricts the passing direction of each of signals amplified by the amplifying means for amplifying multiple types of signals to only one direction, includes a permanent magnet for applying a DC magnetic field to the intersecting portion of the first center electrode and the second center electrode which are disposed on the microwave magnetic body such that they intersect with each other while being insulated from each other. The isolators are disposed such that a DC magnetic field of the permanent magnet is intensified by a DC magnetic field of another permanent magnet. The DC magnetic field applied to each microwave magnetic body is intensified so as to decrease the permeability of the microwave magnetic body. Thus, the inductance of the first and second center electrodes disposed on each microwave magnetic body is reduced. Then, the input impedance of the isolators is also reduced.

Since the input impedance of the isolators is reduced, the input impedance of each of the non-reciprocal circuits (regulating means) can also be reduced, thereby relatively decreasing the impedance conversion ratio between the output impedance of the amplifying means and the input impedance of each of the non-reciprocal circuits. This makes it possible to simplify the configuration of the matching means, which is disposed between the amplifying means and the regulating means which matches the output impedance of the amplifying means to the input impedance of the regulating means (non-reciprocal circuits). Accordingly, since the matching means can be simplified, the insertion loss of the matching means can be reduced, thereby making it possible to enhance the efficiency of the circuit module.

Since the matching means can be simplified, it is possible to reduce the manufacturing cost of the circuit module. Moreover, unlike the related art, it is possible to dispose the non-reciprocal circuits close to each other so that the DC magnetic fields of the permanent magnets can intensify with each other. Accordingly, the design flexibility of the circuit module is increased, thereby making it possible to reduce the size of the circuit module.

Concerning each of the plurality of isolators, one end of the first center electrode may be connected to an input port of the isolator and the other end of the first center electrode may be connected to an output port of the isolator, and one end of the second center electrode may be connected to the input port of the isolator and the other end of the second center electrode may be connected to a ground port of the isolator. Each of the plurality of non-reciprocal circuits may include a capacitor circuit and a terminator circuit which are connected in parallel with an inductor constituted by the first center electrode of the associated isolator.

With this configuration, by setting the inductance of the second center electrode to be greater than the inductance of the first center electrode, when a radio frequency signal is input from an input terminal of a non-reciprocal circuit into an input port of an isolator, a current does not substantially flow into the second center electrode or a terminator, but flows into the first center electrode, and the radio frequency signal is output to an output terminal of the non-reciprocal circuit via an output port of the isolator.

On the other hand, when a radio frequency signal is input from the output terminal of the non-reciprocal circuit to the output port of the isolator, a current is attenuated by the terminator and a parallel resonance circuit constituted by the first center electrode and a capacitor. In this case, by setting the inductance of the second center electrode to be greater than the inductance of the first center electrode, the input impedance of the non-reciprocal circuit can be reduced. Accordingly, the impedance conversion ratio for converting the impedance of the output terminal of the amplifying means to the impedance of the input terminal of the non-reciprocal circuit (regulating means) can be reduced to be even smaller. This makes it possible to further simplify the configuration of the matching means and to further reduce the insertion loss of the matching means.

In order to convert the output impedance of the amplifying means to the predetermined output impedance (for example, 50Ω) of the non-reciprocal circuits (regulating means), two-step impedance conversion is implemented by making a change to the configuration of the matching means and by making a change to the configuration of the passive elements of the non-reciprocal circuits. It is thus possible to increase the design flexibility of the circuit module.

The amplifying means may include one power amplifier for amplifying the plurality of types of signals of different frequency bands, and the matching means may include a matching circuit having a filter function of outputting the plurality of types of signals amplified by the amplifying means to the associated non-reciprocal circuits.

With this configuration, it is not necessary to individually provide power amplifiers for transmission signals of different frequency bands, thereby simplifying the configuration of the amplifying means. It is thus possible to provide a simple, practical circuit module.

Concerning two of the non-reciprocal circuits in which isolators forming the plurality of non-reciprocal circuits are disposed adjacent to each other, the two non-reciprocal circuits may be disposed such that at least one magnetic pole of the permanent magnet of the isolator forming one of the non-reciprocal circuits is adjacent to a magnetic pole of the opposite polarity of the permanent magnet of the isolator forming the other one of the non-reciprocal circuits.

With this configuration, at least one magnetic pole of a permanent magnet of one non-reciprocal circuit is disposed adjacent to a magnetic pole of the opposite polarity of a permanent magnet of the other non-reciprocal circuit. As a result, it is possible to efficiently intensity DC magnetic fields of the permanent magnets.

In this case, the magnetic poles of two of the permanent magnets may be disposed such that they are aligned, or both of magnetic poles of one of the permanent magnets may be disposed adjacent to magnetic poles of the opposite polarities of the other one of the permanent magnets, or the isolators may be disposed such that a straight line passing through both of the magnetic poles of one of the permanent magnets intersects with a straight line passing through both of the magnetic poles of the other one of the permanent magnets.

By disposing the isolators in this manner, it is possible to reliably intensify the DC magnetic fields of the permanent magnets each other.

According to the present invention, isolators are disposed such that the DC magnetic fields of the permanent magnets intensity with each other, and thus, the input impedance of non-reciprocal circuits (regulating means) is reduced. Accordingly, the impedance conversion ratio between the output impedance of amplifying means and the input impedance of each of the non-reciprocal circuits is reduced to be relatively small. Thus, by simplifying the configuration of matching means disposed between the amplifying means and the regulating means, the insertion loss of the matching means can be reduced, thereby enhancing the efficiency of a circuit module. Additionally, it is possible to dispose the non-reciprocal circuits close to each other so that the DC magnetic fields of the permanent magnets can intensity with each other, thereby increasing the design flexibility of the circuit module and accordingly reducing the size of the circuit module.

DETAILED DESCRIPTION OF THE INVENTION

First Embodiment

Figure 1:
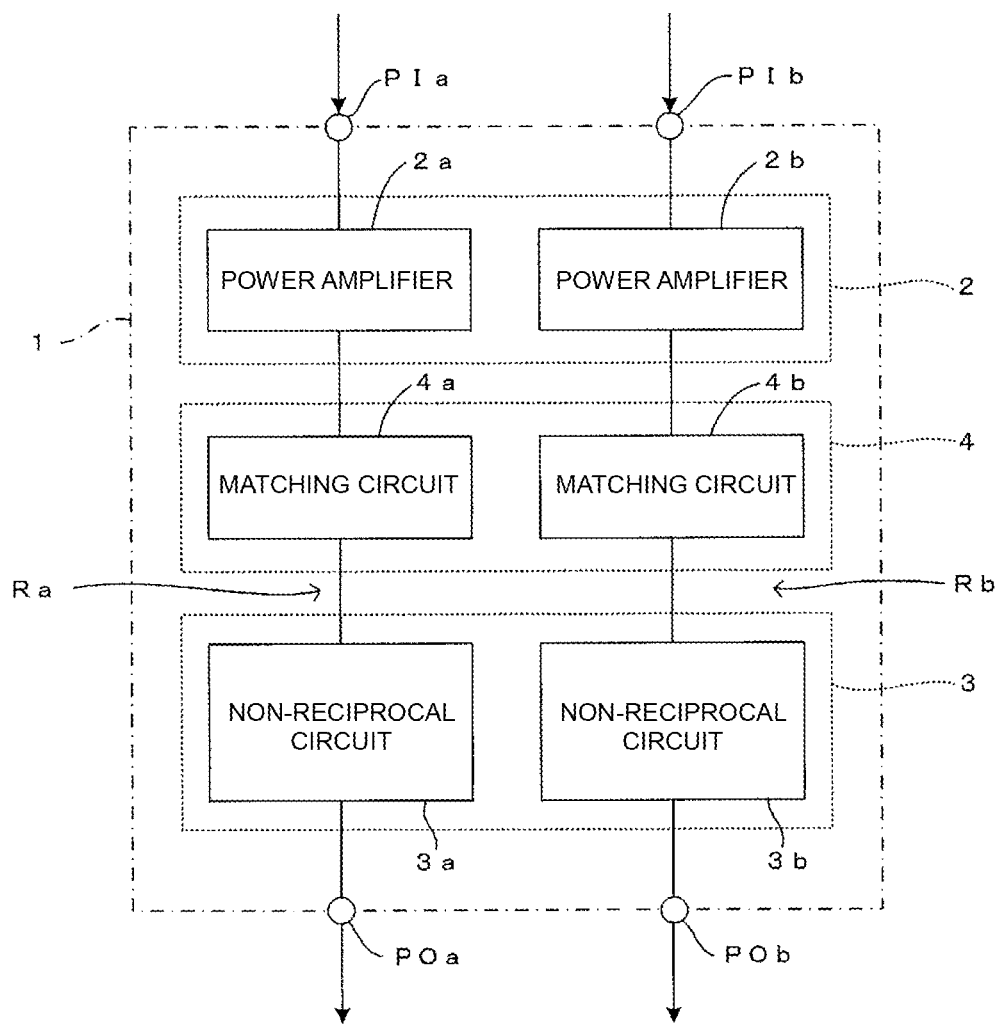
FIG. 1 is a block diagram illustrating a first embodiment of a circuit module of the present invention.
Figure 2:
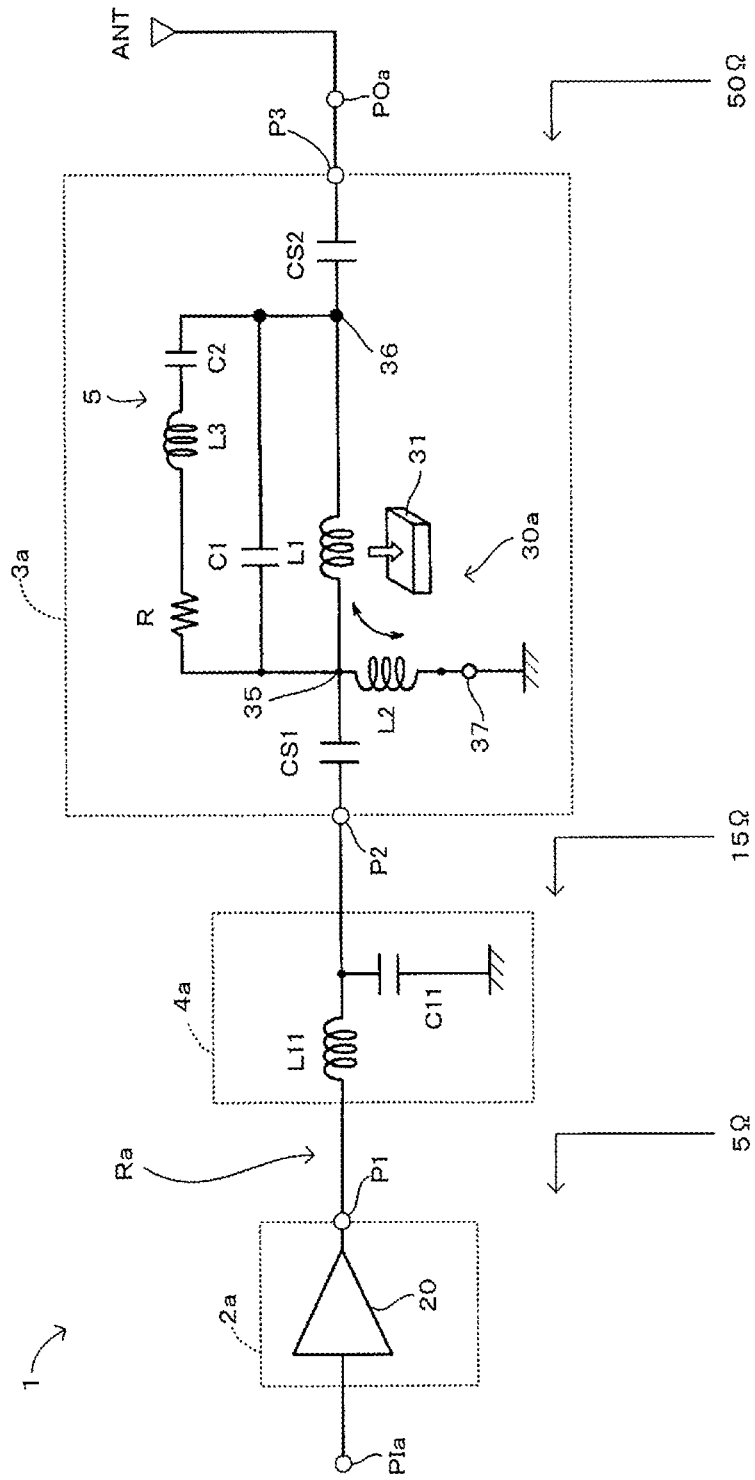
FIG. 2 is a circuit block diagram illustrating the configuration of a transmission route included in the circuit module shown in FIG. 1.
Figure 3:
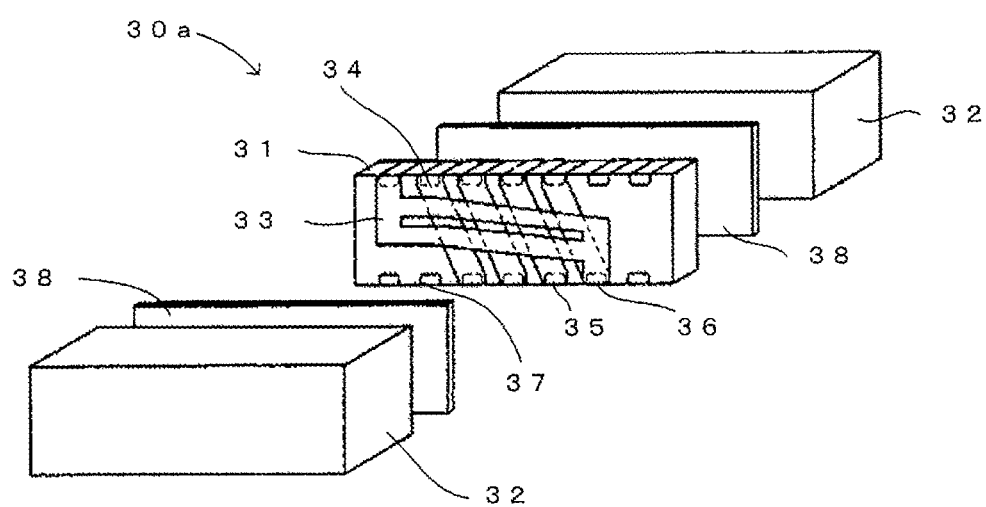
FIG. 3 is an exploded perspective view illustrating ferrite and magnetic elements forming an isolator of a non-reciprocal circuit.
Figure 4:
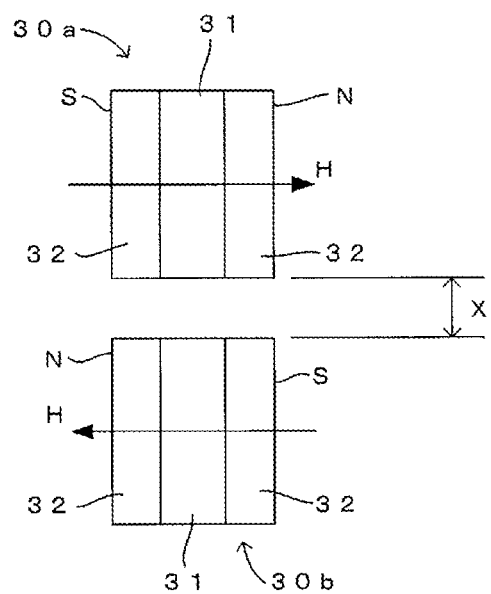
FIG. 4 is a diagram illustrating a state in which isolators are arranged.
Figure 5:
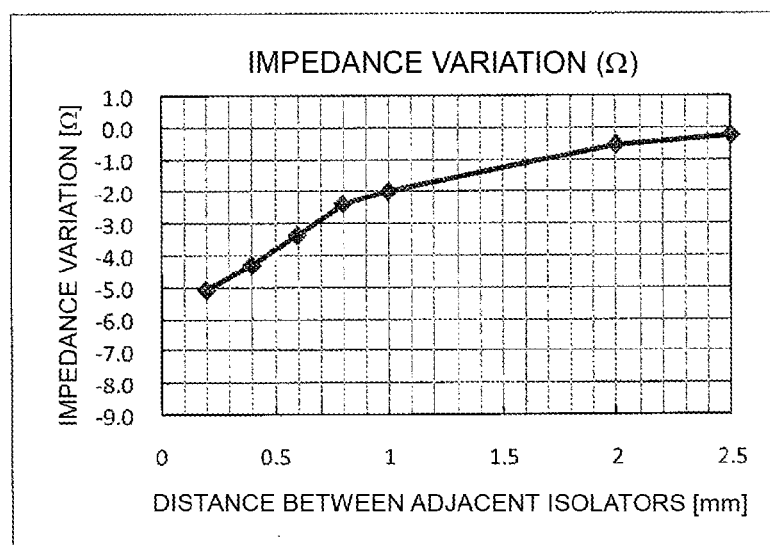
FIG. 5 is a graph illustrating the impedance characteristics obtained when the isolators are arranged in the state shown in FIG. 4.

A first embodiment of a circuit module of the present invention will be described below with reference to FIGS. 1 through 5. FIG. 1 is a block diagram illustrating the first embodiment of a circuit module of the present invention. FIG. 2 is a circuit block diagram illustrating the configuration of a transmission route included in the circuit module shown in FIG. 1. FIG. 3 is an exploded perspective view illustrating ferrite and magnetic elements forming an isolator of a non-reciprocal circuit. FIG. 4 is a diagram illustrating a state in which the isolators are arranged. FIG. 5 is a graph illustrating the impedance characteristics obtained when the isolators are arranged in the state shown in FIG. 4.

A circuit module 1 shown in FIG. 1 is a power amplifier module which is formed by disposing amplifying means 2, regulating means 3, matching means 4, and so on, on a substrate made of, for example, a resin or ceramics. The circuit module 1 is used in a transmission circuit of a mobile communication terminal (communication system), such as a cellular phone or a mobile information terminal. The amplifying means 2 includes power amplifiers 2a and 2b which individually amplify transmission signals (radio frequency signals) of different frequency bands input into input terminals PIa and PIb. The regulating means 3 includes a plurality of non-reciprocal circuits 3a and 3b which are individually disposed corresponding to transmission signals and restricts the passing direction of transmission signals amplified by the amplifying means 2 to only one direction. The matching means 4 is disposed between the amplifying means 2 and the regulating means 3 and includes matching circuits 4a and 4b which match the output impedance of the amplifying means 2 to the input impedance of the regulating means 3. Transmission signals input into the input terminals PIa and PIb, amplified in the circuit module 1, and output from output terminals POa and POb are output to an antenna element via a splitter circuit (not shown), such as a duplexer.

More specifically, the circuit module 1 is a multiband, multimode communication terminal device and includes a first transmission route Ra and a second transmission route Rb. The first transmission route Ra is used for all communications performed by using a first transmission frequency band, such as a transmission frequency band (1920 to 1980 MHz) of W-CDMA (Wideband Code Division Multiple Access) method Band 1, a transmission frequency band (1850 to 1910 MHz) of W-CDMA Band 2, a transmission frequency band (1710 to 1785 MHz) of W-CDMA Band 3, a transmission frequency band (1710 to 1785 MHz) of a GSM (Global System for Mobile Communications) (registered) 1800 method, and a transmission frequency band (1850 to 1910 MHz) of a GSM 1900 method, or such as a transmission frequency band (1920 to 1980 MHz) of LTE (Long Term Evolution)/W-CDMA method Band 1, a transmission frequency band (1850 to 1910 MHz) of LTE/W-CDMA Band 2, a transmission frequency band (1710 to 1785 MHz) of LTE/W-CDMA Band 3. The second transmission route Rb is used for all communications performed by using a second transmission frequency, such as a transmission frequency band (824 to 849 MHz) of W-CDMA Band 5, a transmission frequency band (880 to 915 MHz) of W-CDMA Band 8, a transmission frequency band (806 to 821 MHz and 824 to 849 MHz) of a GSM 800 method, and a transmission frequency band (870.4 to 915 MHz) of a GSM 900 method, or such as a transmission frequency band (824 to 849 MHz) of LTE/W-CDMA Band 5 and a transmission frequency band (880 to 915 MHz) of LTE/W-CDMA Band 8.

The configurations of the transmission routes Ra and Rb of the circuit module 1 will now be discussed in detail. The configurations of the transmission routes Ra and Rb are substantially the same, and thus, an explanation of the configuration of the second transmission route Rb will be omitted by explaining the configuration of the first transmission route Ra.

The power amplifier 2a includes an amplifier element 20 constituted by, for example, a HBT (heterojunction bipolar transistor) forming a common emitter. The amplifier element 20, which is disposed at the output stage of the power amplifier 2a, amplifies a transmission signal input into the input terminal PIa and outputs it from an output terminal P1. In FIG. 2, the amplifier element 20 disposed at the output stage of the power amplifier 2a is only shown, and other amplifier elements forming the power amplifier 2a and an interstage matching circuit disposed between amplifier elements are not shown for the sake of simple representation. Instead of a heterojunction bipolar transistor, a common-source field-effect transistor may be used as the amplifier element.

As shown in FIG. 2, in this embodiment, the output impedance of the power amplifier 2 is set to be about 5Ω.

The non-reciprocal circuit 3a is constituted by an isolator 30a and chip components, such as a chip capacitor, a chip coil, and a chip resistor. The chip components are mounted on a substrate and are used for determining the characteristics of the isolator 30a. The isolator 30a includes microwave ferrite 31 (corresponding to a "magnetic body" of the present invention) having a pair of opposing principal surfaces and a pair of permanent magnets 32. The ferrite 31 is disposed between one magnetic pole of one permanent magnet 32 and the other magnetic pole of the opposite polarity of the other permanent magnet 32. More specifically, the ferrite 31 and the permanent magnets 32 are formed in a rectangular parallelepiped, and the ferrite 31 and the pair of permanent magnets 32 are bonded to each other by using, for example, an epoxy adhesive 38, so that DC magnetic fields H of the permanent magnets 32 will be applied substantially perpendicularly to the principal surfaces of the ferrite 31.

The ferrite 31 includes a first center electrode 33 (inductor L1) and a second center electrode 34 (inductor L2). One end of the first center electrode 33 is connected to an input port 35 and the other end thereof is connected to an output port 36. One end of the second center electrode 34 is connected to the input port 35 and the other end thereof is connected to a ground port 37 in the state in which the second center electrode 34 is insulated from the first center electrode 33 on both principal surfaces of the ferrite 31. The input port 35, the output port 36, and the ground port 37 are disposed on one of the side surfaces which are perpendicular to both principal surfaces of the ferrite 31. DC magnetic fields H are applied from the permanent magnets 32 to a portion at which the first and second center electrodes 33 and 34 intersect with each other.

The first center electrode 33 is formed on the ferrite 31 and is constituted by a conductor film. The first center electrode 33 is raised from the bottom right portion of one principal surface of the ferrite 31 and branches off in two directions. In this state, the first center electrode 33 extends toward the top left portion of the ferrite 31 while being tilted at a comparatively small angle. Then, the first center electrode 33 is raised toward the top left portion and turns around and to the other principal surface of the ferrite 31 via a relay electrode disposed on the top surface. The first center electrode 33 is formed from the top left portion to the bottom right portion on the other principal surface such that it is substantially superposed on the first center electrode 33 formed on the opposing principal surface, as viewed from a direction perpendicularly passing through the two principal surfaces, and is then connected to the input port 35.

The second center electrode 34, which is constituted by a conductor film, is formed on the ferrite 31 in the state in which it is insulated from the first center electrode 33 on both principal surfaces of the ferrite 31. The second center electrode 34 is formed such that it intersects with the first center electrode 33 while being tilted from the bottom right portion of one principal surface of the ferrite 31 toward a long side of the ferrite 31 at a comparatively large angle, turns around the ferrite 31, and is then connected to the ground port 37.

The ferrite 31 may be constituted by, for example, YIG ferrite, and the first and second center electrodes 33 and 34 and the ports 35, 36, and 37 may be formed as a silver or silver-alloy thick or thin film by using a printing, transfer, or photolithographic method. An insulating film for insulating the first and second center electrodes 33 and 34 from each other may be formed as a dielectric thick film made of, for example, glass or alumina, or a resin film made of, for example, polyimide, by using a printing, transfer, or photolithographic method.

The ferrite 31 may be fired integrally with the insulating film and various electrodes by using a magnetic material. In this case, the electrodes are suitably constituted by Pd, Ag, or an alloy thereof, which are resistant to high-temperature firing.

As the material for the permanent magnets 32, any material, such as a strontium ferrite magnet or a lanthanum-cobalt ferrite magnet, may be used. The strontium ferrite magnet exhibits excellent magnetic characteristics, such as the residual magnetic flux density and the coercive force, and also exhibits high insulating properties (small loss characteristics) in a high-frequency band. The lanthanum-cobalt ferrite magnet exhibits excellent magnetic characteristics, such as the residual magnetic flux density and the coercive force, and is suitably used for reducing the size of the circuit module and is also sufficiently used in terms of insulating properties in a high-frequency band.

Between the input port 35 and the output port 36 of the isolator 30a, a capacitor C1 is connected in parallel with the inductor L1 (first center electrode 33) so as to form a resonance circuit constituted by the inductor L1 and the capacitor C1. Between the input port 35 and the output port 36 of the isolator 30a, an LC series resonance circuit 5 connected in series with a terminator R is connected in parallel with the resonance circuit (first center electrode 33) constituted by the inductor L1 and the capacitor C1. In this embodiment, the LC series resonance circuit 5 is constituted by an inductor L3 and a capacitor C2 connected in series with each other. However, the LC series resonance circuit 5 may be formed by interposing the inductor L3 between two capacitors or by interposing the capacitor C2 between two inductors.

Impedance adjusting capacitors CS1 and CS2 are connected to the input port 35 and the output port 36, respectively, of the isolator 30a.

In the non-reciprocal circuit 3a configured as described above, the inductance of the inductor L2 (second center electrode 34) is set to be greater than the inductance of the inductor L1 (first center electrode 33). Accordingly, when a radio frequency signal is input from an input terminal P2 of the non-reciprocal circuit 3a, a current does not substantially flow into the inductor L2 or the terminator R, but flows into the inductor L1, and the radio frequency signal is output from an output terminal P3 of the non-reciprocal circuit 3a. On the other hand, when a radio frequency signal is input from the output terminal P3 of the non-reciprocal circuit 3a in the reverse direction, a backward current is attenuated by the terminator R and the parallel resonance circuit constituted by the inductor L1 and the capacitor C1.

In this case, by setting the inductance of the inductor L2 to be greater than the inductance of the inductor L1, the input impedance of the non-reciprocal circuit 3a is reduced to be about a half of the input impedance of a known non-reciprocal circuit in which both of the input impedance and the output impedance are set to be 50Ω. In this embodiment, the isolators 30a are disposed such that DC magnetic fields of the permanent magnets 32 of the non-reciprocal circuits 3a and 3b intensify with each other, which will be discussed later, and thus, the impedance of the inductors L1 and L2 is reduced, and the input impedance of the non-reciprocal circuits 3a and 3b is set to be about 15Ω.

By suitably adjusting the state in which the first and second center electrodes 33 and 34 are wound around the ferrite 31, for example, by suitably adjusting the intersecting angle of the first and second center electrodes 33 and 34, electrical characteristics, such as the input impedance and the insertion loss, of the non-reciprocal circuit 3 are adjusted. That is, in accordance with an increase in the inductance ratio (L2/L1: the ratio of the second center electrode 34 to the first center electrode 33 wound around the ferrite 31), both of the real part and the imaginary part of the input impedance of the non-reciprocal circuit 3 are increased. By suitably setting the numbers of turns of the first and second center electrodes 33 and 34, the impedance conversion ratio for converting from the input impedance (15Ω) to the output impedance (about 50Ω) can be adjusted. The imaginary part of the impedance is adjusted from a certain value to 0 by the impedance adjusting capacitors CS1 and CS2.

Between the input port 35 and the output port 36 of the non-reciprocal circuit 3a, the LC series resonance circuit 5 connected in series with the terminator R is connected in parallel with the resonance circuit constituted by the inductor L1 (first center electrode 33) and the capacitor C1. Accordingly, when a radio frequency signal is input into the output terminal P3 of the non-reciprocal circuit 3a in the reverse direction, impedance matching is performed in a wide band by the impedance characteristics of the terminator R and the LC series resonance circuit 5. Thus, over a wide frequency band, isolation characteristics of the non-reciprocal circuit 3a can be improved and insertion loss of the non-reciprocal circuit 3 of the transmission module can be reduced.

As shown in FIG. 2, the matching circuit 4a is formed as a single-stage low pass filter constituted by an inductor L11 and a capacitor C11. In this embodiment, by the matching circuit 4a, as shown in FIG. 2, the output impedance 5Ω of the power amplifier 2a is converted into the input impedance 15Ω of the non-reciprocal circuit 3a.

The arrangement states of the isolators 30a and 30b included in the non-reciprocal circuits 3a and 3b, respectively, will be discussed below.

The non-reciprocal circuits 3a and 3b are disposed such that at least one magnetic pole N of a permanent magnet 32 of one non-reciprocal circuit 3a (isolator 30a) is adjacent to a magnetic pole S, which is the opposite polarity of the magnetic pole N, of the other non-reciprocal circuit 3b (isolator 30b). That is, the isolators 30a and 30b are disposed such that a DC magnetic field H of a permanent magnet 32 of one isolator 30a and a DC magnetic field H of a permanent magnet 2 of the other isolator 30b intensify with each other more closely. More specifically, in this embodiment, as shown in FIG. 4, the magnetic poles N and S of a permanent magnet 32 of one isolator 30a are disposed adjacent to the magnetic poles S and N, which are the opposite polarities of the magnetic poles N and S, respectively, of a permanent magnet 32 of the other isolator 30b.

Figure 7:
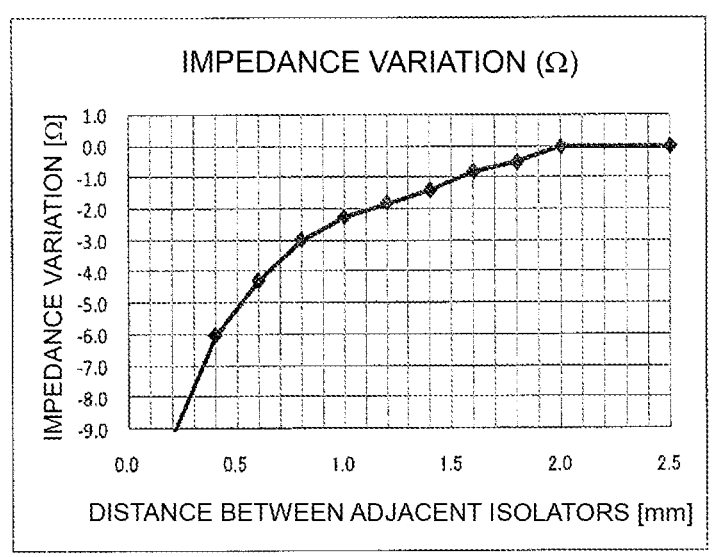
FIG. 7 is a graph illustrating the impedance characteristics obtained when the isolators are arranged in the state shown in FIG. 6.
Figure 9:
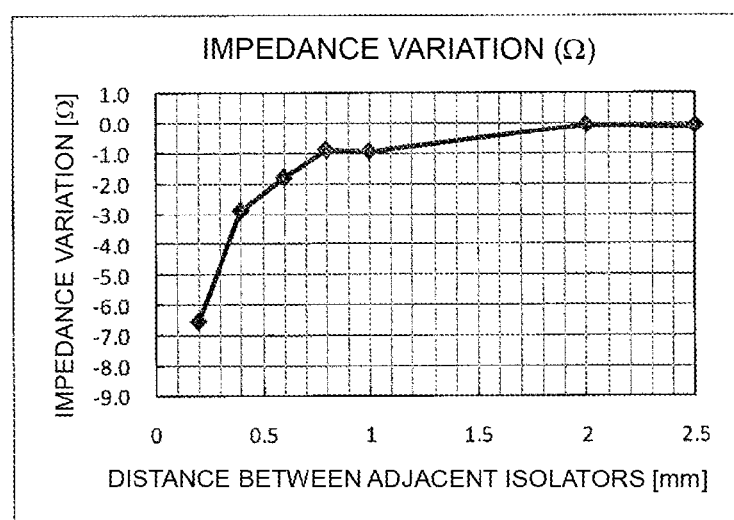
FIG. 9 is a graph illustrating the impedance characteristics obtained when the isolators are arranged in the state shown in FIG. 8.

With this configuration, as shown in FIG. 5, as the distance x between the isolators 30a and 30b decreases, the DC magnetic fields H intensify with each other more closely, and the input impedance of each of the non-reciprocal circuits 3a and 3b is reduced. In FIG. 5, the horizontal axis indicates the distance x between the isolators 30a and 30b, and the vertical axis indicates a variation in the input impedance of each of the non-reciprocal circuits. FIGS. 7 and 9, which will be referred to when discussing modified examples later, are indicated in a similar manner, and thus, an explanation thereof will be omitted.

First Modified Example

Figure 6:
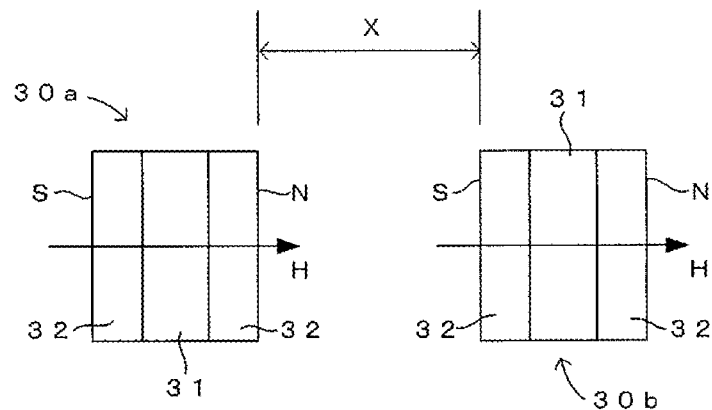
FIG. 6 is a diagram illustrating a first modified example of a state in which isolators are arranged.

A first modified example of the arrangement state of the isolators will be discussed below with reference to FIGS. 6 and 7. FIG. 6 is a diagram illustrating a first modified example of a state in which the isolators are arranged, and FIG. 7 is a graph illustrating the impedance characteristics obtained when the isolators are arranged in the state shown in FIG. 6.

As shown in FIG. 6, in the first modified example, the magnetic poles N and S of the permanent magnets 32 of the isolators 30a and 30b are aligned so that the directions from the magnetic pole N to the magnetic pole S will be the same. According to this arrangement state of the isolators 30a and 30b, too, as shown in FIG. 7, as the distance x between the isolators 30a and 30b decreases, the DC magnetic fields H intensify with each other more closely, and the input impedance of each of the non-reciprocal circuits 3a and 3b is reduced.

Second Modified Example

Figure 8:
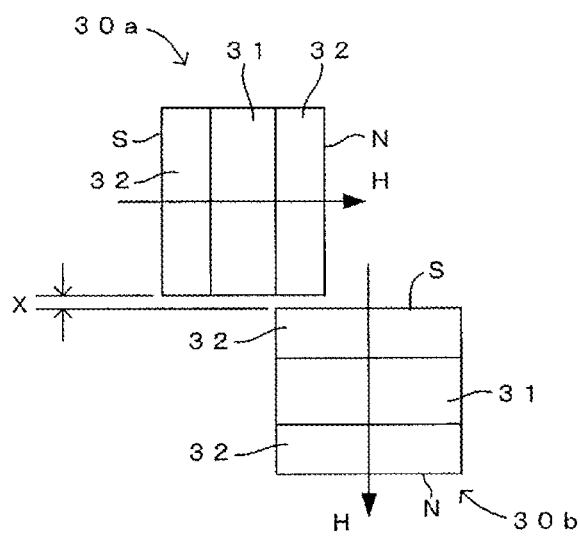
FIG. 8 is a diagram illustrating a second modified example of a state in which isolators are arranged.

A second modified example of the arrangement state of the isolators will be discussed below with reference to FIGS. 8 and 9. FIG. 8 is a diagram illustrating a second modified example of a state in which the isolators are arranged, and FIG. 9 is a graph illustrating the impedance characteristics obtained when the isolators are arranged in the state shown in FIG. 8.

As shown in FIG. 8, in the second modified example, the isolators 30a and 30b are disposed such that a straight line perpendicularly passing through both magnetic poles of the permanent magnets 32 of one isolator 30a intersects with a straight line perpendicularly passing through both magnetic poles of the permanent magnets 32 of the other isolator 30b. According to this arrangement state of the isolators 30a and 30b, too, as shown in FIG. 9, as the distance x between the isolators 30a and 30b decreases, the DC magnetic fields H intensify with each other more closely, and the input impedance of each of the non-reciprocal circuits 3a and 3b is reduced.

As described above, according to the above-described embodiment, each of the isolators 30a and 30b of the plurality of the non-reciprocal circuits 3a and 3b, respectively, included in the regulating means 3, which restricts the passing direction of transmission signals amplified by the amplifying means 2 for amplifying multiple types of signals of different frequency bands to only one direction, includes permanent magnets 32 for applying DC magnetic fields H to the intersecting portion of the first center electrode 33 (inductor L1) and the second center electrode 34 (inductor L2) which are disposed on the microwave ferrite 31 such that they intersect with each other while being insulated from each other. The isolators 30a and 30b are disposed such that a DC magnetic field H of one permanent magnet 32 is intensified by a DC magnetic field H of another permanent magnet 32. The DC magnetic field H applied to each ferrite 31 is intensified so as to decrease the permeability of the ferrite 31. Thus, the inductance of the first and second center electrodes 33 and 34 disposed on each ferrite 31 is reduced. Then, the input impedance of the isolators 30a and 30b is also reduced.

Since the input impedance of the isolators 30a and 30b is reduced, the input impedance of each of the non-reciprocal circuits 3a and 3b can also be reduced, thereby decreasing the impedance conversion ratio between the output impedance of the amplifying means 2 and the input impedance of each of the non-reciprocal circuits 3a and 3b. This makes it possible to simplify the configuration of the matching means 4 (matching circuits 4a and 4b), which is disposed between the amplifying means 2 and the regulating means 3 (non-reciprocal circuits 3a and 3b) and which matches the output impedance of the amplifying means 2 to the input impedance of each of the non-reciprocal circuits 3a and 3b. Accordingly, the insertion loss of the matching means 4 can be reduced, and thus, the power efficiency of the circuit module 1 can be enhanced.

Since the matching means 4 can be simplified, it is possible to constitute the matching means 4 by matching circuits 4a and 4b, each of which is a simple, practical, single-stage low pass filter constituted by an inductor L11 and a capacitor C11, thereby reducing the manufacturing cost of the circuit module 1. Moreover, unlike the related art, it is possible to dispose the non-reciprocal circuits 3a and 3b close to each other so that the DC magnetic fields H of the permanent magnets 32 can intensify with each other. Accordingly, the design flexibility of the circuit module 1 is increased, thereby making it possible to reduce the size of the circuit module 1.

By setting the inductance of the second center electrode 34 to be greater than the inductance of the first center electrode 33, the input impedance of the non-reciprocal circuits 3a and 3b is reduced. Accordingly, the impedance conversion ratio for converting the impedance of the output terminal P1 of the amplifying means 2 to the impedance of the input terminal P2 of the non-reciprocal circuits 3a and 3b (regulating means 3) can be reduced to be even smaller. This makes it possible to further simplify the configuration of the matching means 4 and to further reduce the insertion loss of the matching means 4.

In order to convert the output impedance of the amplifying means 2 to the predetermined output impedance (for example, 50Ω) of the regulating means 3 (non-reciprocal circuits 3a and 3b), two-step impedance conversion is implemented by making a change to the configuration of the matching means 4 and by making a change to the configuration of the passive elements and the isolators 30a and 30b of the non-reciprocal circuits 3a and 3b. It is thus possible to increase the design flexibility of the circuit module 1.

The isolators 30a and 30b are disposed such that the magnetic poles N and S of the permanent magnets 32 of the isolators 30a and 30b are aligned, or such that both magnetic poles N and S of a permanent magnet 32 of one isolator are disposed adjacent to the magnetic poles S and N, which are the opposite polarities of the above-described magnetic poles N and S, respectively, of a permanent magnet 32 of the other isolator, or such that a straight line formed by both magnetic poles N and S of a permanent magnet 32 of one isolator intersects with a straight line formed by both magnetic poles N and S of a permanent magnet 32 of the other isolator. With this arrangement, one magnetic pole N of a permanent magnet 32 of one non-reciprocal circuit 3a is disposed adjacent to a magnetic pole S, which is the opposite polarity of the magnetic pole N, of a permanent magnet 32 of the other non-reciprocal circuit 3b. As a result, it is possible to reliably and efficiently intensity DC magnetic fields H of the permanent magnets 32 of both of the isolators 30a and 30b.

In the circuit module 1, transmission signals of multiple frequency bands or different communication systems can be amplified with low insertion and with high efficiency. Accordingly, it is not necessary to individually provide transmission routes for different frequency bands or different communication systems, and instead, transmission signals of different frequency bands can be amplified and transmitted by the common circuit module 1, thereby enhancing the efficiency and also simplifying the components of a device on which the circuit module 1 is mounted.

More specifically, as stated above, the circuit module 1 exhibiting excellent transmission characteristics and isolation characteristics in a wide band is suitably used in a multi-band, multimode communication system, such as a communication system that performs wireless communication by supporting Band 1, Band 2, and Band 3 of the W-CDMA method, GSM 1800 method, and GSM 1900 method, a communication system that performs wireless communication by supporting Band 5 and Band 8 of the W-CDMA method, GSM 800 method, and GSM 900 method, and a communication system that performs wireless communication by supporting Band 1, Band 2, and Band 3 of the W-CDMA method and Band 1, Band 2, and Band 3 of the LTE method.

Second Embodiment

Figure 10:
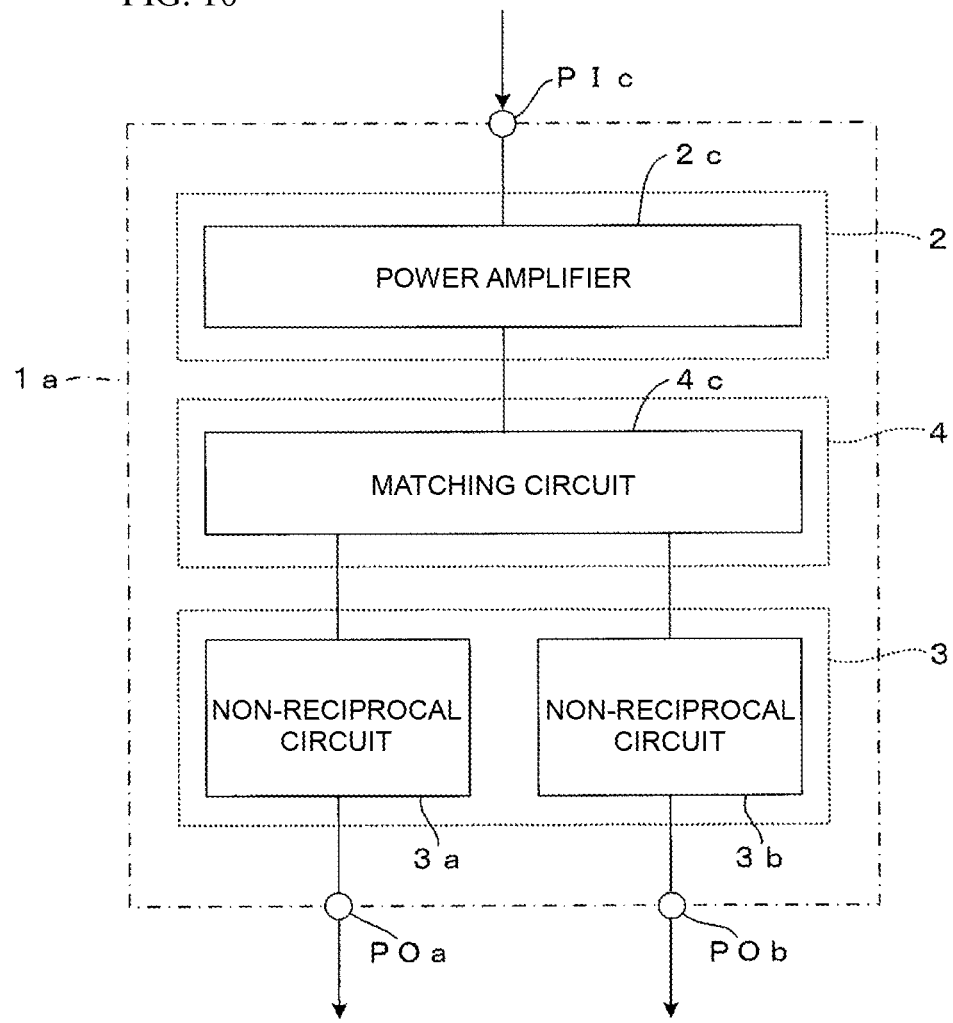
FIG. 10 is a block diagram illustrating a second embodiment of a circuit module of the present invention.
Figure 11:
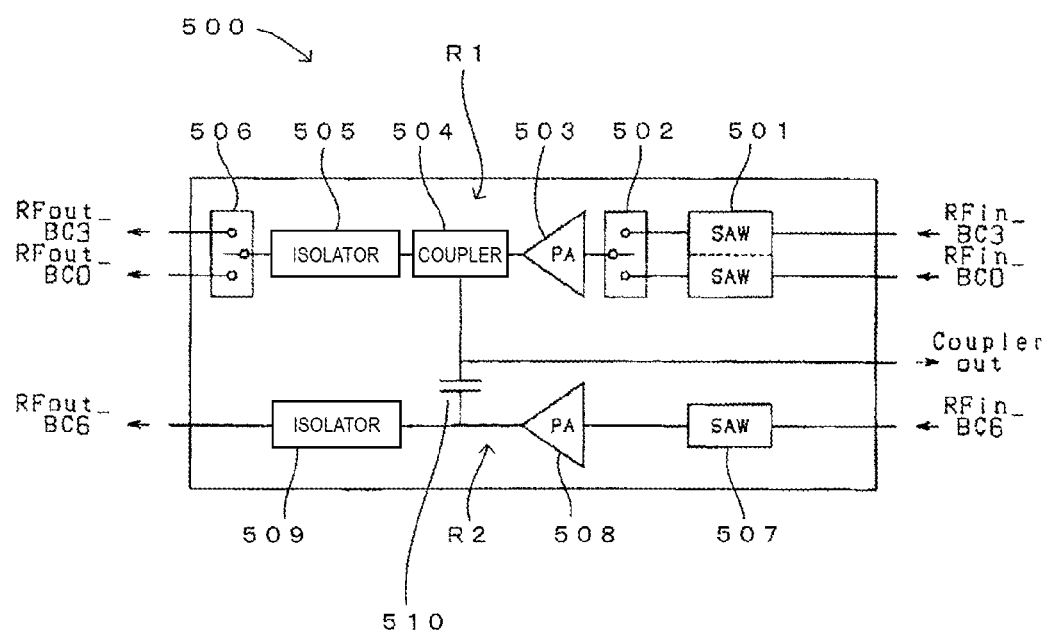
FIG. 11 is a diagram illustrating a known circuit module.

A second embodiment of a circuit module of the present invention will be described below with reference to FIG. 10. FIG. 10 is a block diagram illustrating the second embodiment of a circuit module of the present invention.

A circuit module 1a shown in FIG. 10 is different from the above-described circuit module 1 in the following points. The amplifying means 2 includes a single power amplifier 2c for amplifying transmission signals of different frequency bands input from an input terminal PIc. The matching means 4 includes a matching circuit 4c having a filter function of outputting transmission signals amplified by the amplifying means 2 (power amplifier 2c) to the non-reciprocal circuits 3a and 3b. The configurations of the other elements are similar to those of the above-described embodiment, and thus, the other elements are designated by like reference numerals, and an explanation thereof will be omitted. As the configurations of the power amplifier 2c and the matching circuit 4c, any known configuration may be used, and thus, a detailed explanation thereof will be omitted.

In this embodiment, in addition to advantages similar to those obtained by the above-described embodiment, the following advantages are also achieved. It is not necessary to individually provide power amplifiers for transmission signals of different frequency bands, thereby simplifying the configuration of the amplifying means 2. It is thus possible to provide a simple, practical circuit module 1a.

The present invention is not restricted to the above-described embodiments, and various modifications other than the modifications discussed above may be made without departing from the spirit of the invention. For example, the characteristics of the circuit modules 1 and 1a are only examples, and the configurations of the amplifying means 2, the regulating means 3, and the matching means 4 may be suitably designed as described above according to the frequency band to be used or the configuration of a wireless communication device or a mobile communication terminal in which the circuit module 1 is used.

In the above-described embodiments, the regulating means 3 includes two non-reciprocal circuits 3a and 3b. However, the number of non-reciprocal circuits included in the regulating means 3 is not restricted to two, and the regulating means 3 may include three or more non-reciprocal circuits so that the circuit module 1 can process more transmission signals. Additionally, the arrangement state of the isolators included in the non-reciprocal circuits is not restricted to the above-described examples, and the isolators may be arranged in any manner as long as the DC magnetic field H of one permanent magnet is intensified by the DC magnetic field of another permanent magnet.

The configuration of each of the non-reciprocal circuits 3a and 3b is not restricted to a configuration including the above-described isolator 30. Instead, a known isolator having another configuration may be suitably used as each of the non-reciprocal circuits 3a and 3b. The non-reciprocal circuit 3 may be constituted by a circulator.

Electronic components disposed on a substrate included in the circuit module 1 are not restricted to the above-described examples, and optimal electronic components may be suitably selected and mounted on the substrate according to the intended use or the design of the circuit module 1. For example, an interstage filter (SAW filter) or a power detector may also be mounted on the circuit module 1, or a switch, a multiplexer, such as a diplexer, or a coupler may also be mounted on the circuit module 1. The above-described passive elements, such as the inductors L3 and L11, the capacitors C1, C2, and C11, and the terminator R, do not have to be chip components mounted on the substrate, but may be components integrated in the substrate or may be formed by a wiring pattern within the substrate. The transistor of the amplifier element 20 may be constituted by a known amplifier element, such as an FET, instead of the above-described HBT.

In the above-described embodiments, the matching means 4 (matching circuits 4a and 4b) is formed as a single-stage low pass filter. However, the matching means 4 may be formed in any manner, such as a multiple-stage (for example, two-stage or three-stage) low pass filter or a high pass filter. The matching means 4 may be formed as a known circuit configuration according to the necessity.

The present invention is widely applicable to a circuit module including amplifying means for amplifying multiple types of signals.

1, 1a circuit module
2 amplifying means
2c power amplifier
3 regulating means
3a, 3b non-reciprocal circuit
30a, 30b isolator
31 ferrite (magnetic body)
32 permanent magnet
33 first center electrode
34 second center electrode
35 input port
36 output port
37 ground port
4 matching means
H DC magnetic field
N one magnetic pole
S opposite magnetic pole

The invention claimed is:

1. A circuit module comprising:
amplifying means for amplifying a plurality of types of signals;
regulating means for restricting a passing direction of each of the plurality of types of signals amplified by the amplifying means to one direction, wherein the regulating means includes a plurality of non-reciprocal circuits individually disposed for the plurality of types of signals; and
matching means for matching an output impedance of the amplifying means with an input impedance of the regulating means, wherein the matching means is disposed between the amplifying means and the regulating means,
the plurality of non-reciprocal circuits including respective isolators,
each of the isolators including
a microwave magnetic body,
a first center electrode and a second center electrode disposed on the microwave magnetic body such that the first and second center electrodes intersect with each other while being insulated from each other, and
a permanent magnet for applying a direct-current magnetic field to a portion at which the first and second center electrodes intersect with each other,
wherein among the isolators, at least two isolators are disposed such that a direct-current magnetic field of one permanent magnet of one isolator and a direct-current magnetic field of another permanent magnet of another isolator intensify with each other.

2. The circuit module according to claim 1, wherein:
one end of the first center electrode in each of the isolators is connected to an input port of each of the isolators and another end of the first center electrode in each of the isolators is connected to an output port of each of the isolators, and one end of the second center electrode in each of the isolators is connected to the input port of each of the isolators and another end of the second center electrode in each of the isolators is connected to a ground port of each of the isolators; and
each of the plurality of non-reciprocal circuits includes a capacitor circuit and a terminator circuit connected in parallel with an inductor constituted by the first center electrode of the associated isolator.

3. The circuit module according to claim 2, wherein:
the amplifying means includes one power amplifier for amplifying the plurality of types of signals of different frequency bands; and
the matching means includes a matching circuit having a filter function of outputting the plurality of types of signals amplified by the amplifying means to the respective non-reciprocal circuits.

4. The circuit module according to claim 2, wherein one of the isolators constituting the plurality of non-reciprocal circuits include two of the non-reciprocal circuits disposed adjacent to each other, the two non-reciprocal circuits are disposed such that at least one magnetic pole of the one permanent magnet of an isolator forming one of the non-reciprocal circuits is adjacent to an opposite polarity magnetic pole of the other permanent magnet of an isolator forming another one of the non-reciprocal circuits.

5. The circuit module according to claim 1, wherein:
the amplifying means includes one power amplifier for amplifying the plurality of types of signals of different frequency bands; and
the matching means includes a matching circuit having a filter function of outputting the plurality of types of signals amplified by the amplifying means to the respective non-reciprocal circuits.

6. The circuit module according to claim 5, wherein one of the isolators constituting the plurality of non-reciprocal circuits include two of the non-reciprocal circuits disposed adjacent to each other, the two non-reciprocal circuits are disposed such that at least one magnetic pole of the one permanent magnet of an isolator forming one of the non-reciprocal circuits is adjacent to an opposite polarity magnetic pole of the other permanent magnet of an isolator forming another one of the non-reciprocal circuits.

7. The circuit module according to claim 1, wherein one of the isolators constituting the plurality of non-reciprocal circuits include two of the non-reciprocal circuits disposed adjacent to each other, the two non-reciprocal circuits are disposed such that at least one magnetic pole of the one permanent magnet of an isolator forming one of the non-reciprocal circuits is adjacent to an opposite polarity magnetic pole of the other permanent magnet of an isolator forming another one of the non-reciprocal circuits.

8. The circuit module according to claim 7, wherein the one magnetic pole and the opposite polarity magnetic pole of two of the permanent magnets are aligned with each other.

9. The circuit module according to claim 7, wherein both of magnetic poles of the one permanent magnet are disposed adjacent to opposite polarity magnetic poles of the other permanent magnet.

10. The circuit module according to claim 7, wherein the isolators are disposed such that a straight line formed by both of magnetic poles of the one permanent magnet intersects with a straight line formed by both of magnetic poles of the other permanent magnet.

* * * * *